United States Patent [19]

Lapeyre

[11] Patent Number: 4,924,431
[45] Date of Patent: May 8, 1990

[54] KEYBOARD LOCATED INDICIA FOR INSTRUCTING A MULTI-MODE PROGRAMMABLE COMPUTER HAVING ALPHANUMERIC CAPABILITIES FROM A FEW KEYBOARD KEYS

[75] Inventor: James M. Lapeyre, New Orleans, La.

[73] Assignee: The Laitram Corporation, New Orleans, La.

[21] Appl. No.: 331,043

[22] Filed: Mar. 29, 1989

Related U.S. Application Data

[63] Continuation of Ser. No. 844,872, Mar. 27, 1986, abandoned, which is a continuation-in-part of Ser. No. 729,559, May 2, 1985, which is a continuation-in-part of Ser. No. 459,998, Jan. 21, 1983, Pat. No. 4,547,860.

[51] Int. Cl.⁵ .............................................. G06F 3/023
[52] U.S. Cl. ............................ 364/709.16; 364/709.15
[58] Field of Search ....................... 364/719.16, 719.15; 341/22

[56] References Cited

U.S. PATENT DOCUMENTS

| | | | |
|---|---|---|---|
| 3,675,513 | 7/1972 | Flanagan et al. | 379/104 |
| 3,863,060 | 1/1975 | Rode et al. | 364/709.04 |
| 3,892,958 | 7/1975 | Tung | 364/709.15 |
| 3,967,273 | 6/1976 | Knowlton | 341/22 |
| 4,120,040 | 10/1978 | Aihara | 364/709.15 |
| 4,202,038 | 5/1980 | Petersson | 364/709.15 |
| 4,272,826 | 6/1981 | Deutsch | 364/709.15 |
| 4,279,022 | 7/1981 | Abe | 364/900 |
| 4,302,816 | 11/1981 | Yamamoto | 364/709.16 |
| 4,344,869 | 8/1982 | Prame | 341/26 |
| 4,348,733 | 9/1982 | Harrison | 364/709.16 |
| 4,510,583 | 4/1985 | Walz et al. | 364/900 |

*Primary Examiner*—David H. Malzahn
*Attorney, Agent, or Firm*—Laurence R. Brown

[57] ABSTRACT

More computer commands in multi-purpose programmable electronic computers are made with fewer keys in keyboard assemblies having therewith integrally located instruction indicia showing a key stroke sequence for selection of a large range of instruction commands. In achieving this the computer operates in at least two modes with one mode requiring two key strokes in mutually exclusive time sequence for each command entry. In a preferred embodiment, a single stroke mode is used for numerical entries and a third mode provides for facilitated alphanumeric entries for writing programs in a simplified form. The keys, strokes, and command instructions are cooperatively integrated by means of coded indicia which permits condensed display of a large range of the computer instructions available from a few keys so that reference to manual instructions is not necessary.

8 Claims, 4 Drawing Sheets

| 1 | 2 | 3 |
|---|---|---|
| $A_1$ $B_3$ $C_6$ / $J_4$ $K_5$ $L_2$ | $D_1$ $E_2$ $F_6$ / $M_4$ $N_3$ $O_5$ | $G_4$ $H_2$ $I_3$ / $P_5$ $Q_1$ $R_6$ |
| $S_1$ $T_4$ $U_5$ / $W_6$ $X_2$ $Y_3$ | $V_6$ $1_1$ $2_2$ / $Z_5$ $6_4$ $7_3$ | $3_3$ $4_4$ $5_5$ / $8_2$ $9_1$ $0_6$ |
| 4 | 5 | 6 |

| 7 | 8 | 9 |
|---|---|---|
| A 7  B 3  C 9 / J 2  K 8  L 6 / S 1  T 4  U 5 / · ∧ : 0 →$\frac{X}{Q}$ | D 7  E 5  F 8 / M 9  N 4  O 6 / V 3  W 1  X 2 / ; ∧   0 →$\frac{X}{Q}$ | G 7  H 9  I 6 / P 5  Q 8  R 3 / Y 1  Z 2  - 4 / ? ∧ ÷ 0 →$\frac{X}{Q}$ |
| 1 | 2 | 3 |
| ∧ | 0 | X |

FIG. 4

KEYBOARD LOCATED INDICIA FOR INSTRUCTING A MULTI-MODE PROGRAMMABLE COMPUTER HAVING ALPHANUMERIC CAPABILITIES FROM A FEW KEYBOARD KEYS

This is a continuation of Ser. No. 06/844,872 filed Mar. 27, 1986, now abandoned, which is a continuation-in-part of U.S. Ser. No. 729,559 filed May 2, 1985 for "Programmable Computer With Alphanumeric Capabilities Having Few Keyboard Keys", (now Ser. No. 07/331,049 filed Mar. 29, 1989) which in turn is a continuation-in-part of U.S. Ser. No. 459,998 filed Jan. 21, 1983 for "Computer Keyboards With Few Keys Designating Hundreds of Functions", now U.S. Pat. No. 4,547,860 of Oct. 15, 1985. These applications are incorporated herein in entirety by reference.

TECHNICAL FIELD

This invention relates to keyboards for instruction display panels coordinating inputting alphanumeric instructions and/or data into computers operating in multiple modes and more particularly it relates to the facile input of a set of alpha and numeric characters using two successive key strokes per character from as few as six keys.

BACKGROUND ART

The above identified parent applications, and other disclosures such as U.S. Pat. No. 3,892,958 to C. Tung of July 1, 1975 relate to the programmable multi-purpose computer art. U.S. Pat. No. 3,967,273 to K. Knowlton of June 29, 1976; British Specification No. 1417849 filed Dec. 20, 1972; and European Patent Application 11,307 filed Nov. 19, 1979 relate to the multiple use of keyboard keys for reducing the number of keys required on a keyboard for typewriters and telephones. The parent applications relate to keyboard configurations particularly desirable in miniaturized multi-purpose computer systems now feasible in the art which are capable of many hundreds of functions and which require both numerics and alphabets in their communication, calculating and data processing operations.

The Knowlton patent, for example, represents the state of related prior art keyboards which reduce the number of keys required for alphanumeric capabilities in a telephone system by requiring two successive key stroke choices for every entry digit such as numeral 2 or letter k. However, many more keys are required in multiple purpose computers as seen by the Tung patent which provides for most keys to have three functions, wherein two sets of functions are respectively chosen by respective orange or blue prefix keys so that a calculator with thirty-two keys can be used for about three times that many functional computer entries including instructions and data. This latter concept is used, for example, in "Hewlett-Packard" Model HO-41 type programmable calculators with full alphabetic capabilities. Similarly "Texas Instruments" TI-88 line of programmable calculators have alphabetic capabilities with two keyboard functions selectable, plus an alphabetic entry mode.

The general state of the art of calculator systems with complex many functional capacity is represented by U.S. Pat. No. 3,863,060 to F. Rode et al. of Jan. 28, 1975.

However, the state of such prior art calculators has made programming and particularly programming in the alpha mode awkward and time consuming because of the necessity to use many key strokes in entry of complex instructions such as associated with writing programs. In particular the sequence of key stroke entries required for entering alphabet letters into program steps being formulated are burdensome in time taken and are so complex that a programmer must of necessity refer to complex sequences set out in instruction manuals, which may not even be accessible with the computer keyboard, particularly in the case of portable computers.

Also, many of these prior art calculators have introduced alpha capabilities at the expense of utilizing 26 separate keys for the alphabet. Thus, calculators or computers with few key keyboards in the art have been deficient in their capacity to control many calculator functions with concurrent alphanumeric capability that can be easily used and rapidly programmed in the alphanumeric mode.

It is therefore an objective of this invention to provide improved alphanumeric capabilities in computers and data processing system with simplified keyboards and instructions, and in particular to overcome the aforesaid deficiencies of the prior art. Other objects, features and advantages will be found throughout the following description, drawing and claims.

DISCLOSURE OF THE INVENTION

A keyboard and system for operating same is provided having increased efficiency of the number of functions performable by a small number of keys, such as six, twelve or sixteen in a keyboard assembly. Cooperatively associated with the keys in a visible location integral with the keyboard assembly is a set of abbreviated instruction indicia designating key stroke selection sequences available from the computer for processing a corresponding set of computer commands for data entry and data processing operations. The keyboard of the preferred embodiment provides for entry of a set of key actuated computer operations including a subset of a very large number of calculator command functions for data processing, a subset of numeric characters is processable by the computer and a full subset of alpha characters processable by the computer. This is achieved by way of a computer mode of operation responsive to sequential stroking of two keys in a mutually exclusive time sequence for each key command signal. Furthermore, the system is operable in at least one other mode for performing a different set of computer commands selected by stroking the keys. In the preferred embodiment three modes are successively selected from the keyboard, namely, (a) a calculating keyboard mode (normal mode) for primary entry of a first set of data and control functions in response to single keystrokes, (b) a control mode for entry of command functions in response to at least two key strokes from predetermined combinations of the keys, and (c) a programming mode for entry of alphanumeric data and commands in response to two keystrokes from predetermined combinations of a subset of six of said keys.

In general, significant and unexpected advantage is made in using the keyboard, which with very few keys operates surprisingly to afford a very large number of computer commands, and which even more surprisingly reduces significantly the time of entry of data and programs, and affords simplified program command access instructions which eliminates the need for access to programming manuals in most instances, thus making portable computers useful over a large range of data processing capabilities wherever they are carried.

In particular, significant advantage is obtained in a programmable calculator with alphanumeric capabilities, namely the facile entry of alphanumeric entries in the alpha mode. In this two stroke mode it is possible to enter the full 26 letter alphabet plus the decimal digits 0 through 9 with as few as six keys, although seven keys are preferred since some decimal and control functions are usually required. It is preferable, however, that the total working minimum number of keys be 12, because the use of 12 keys permits the decimal digits, the decimal point and a control function, to all be executed in one mode by a single key stroke for arithmetic operations. The entry of a single alpha letter on the other hand requires 2 distinct key strokes in an alpha mode. The speed of entry is not hampered when operating in a hunt and peck mode, however, since the area of search, (compared to a single key, single letter keyboard) for the desired letter is reduced to about 1/9 of the single stroke keyboard area and if, for example, contained in a very small area occupied by only, for example, 3 keys. In fact, searching over such a small area for the desired letter, (on one of 3 keys), touching that key and then touching a second key at a known position, as indicated by the indicia localized at the site of the first key touched, is sometimes faster than searching for a letter amount 26 keys and then striking that key once. Obviously this system is more efficacious for the hunt and peck method of alpha entry over the touch system. Nonetheless, it is easily learned for the touch system and for persons so inclined it soon becomes as facile if not more so than the usual single-key single-letter system requiring so many more keys.

BRIEF DESCRIPTION OF THE DRAWINGS

In the drawings:

FIG. 1 is a plan view of a preferred embodiment of a keyboard layout embodying the invention and having all 26 of the alphabet letters located on only 3 of the sixteen keys;

FIG. 3 is a 6-key keyboard layout capable of entering all 26 letters of the alphabet and the decimal digits 0 through 9 in a two-stroke mode, FIG. 4 is a 7-key keyboard capable of entering all alpha numerics plus many other functions; and FIG. 5 is an embodiment for calculator use showing the preferred minimum number of keys wherein the numerics can be single stroke operated.

THE PREFERRED EMBODIMENT

Figure 1:
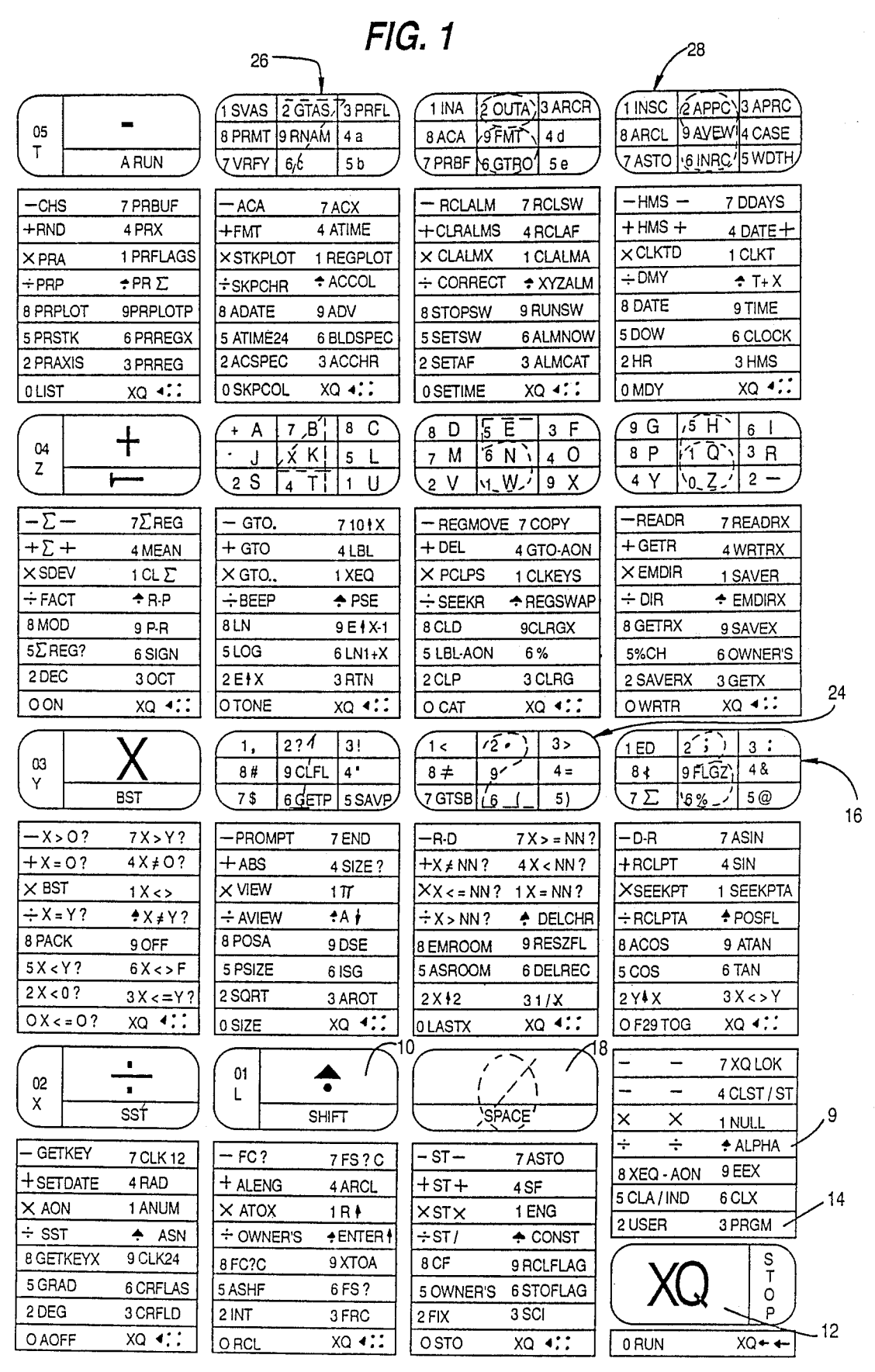
Figure 2:
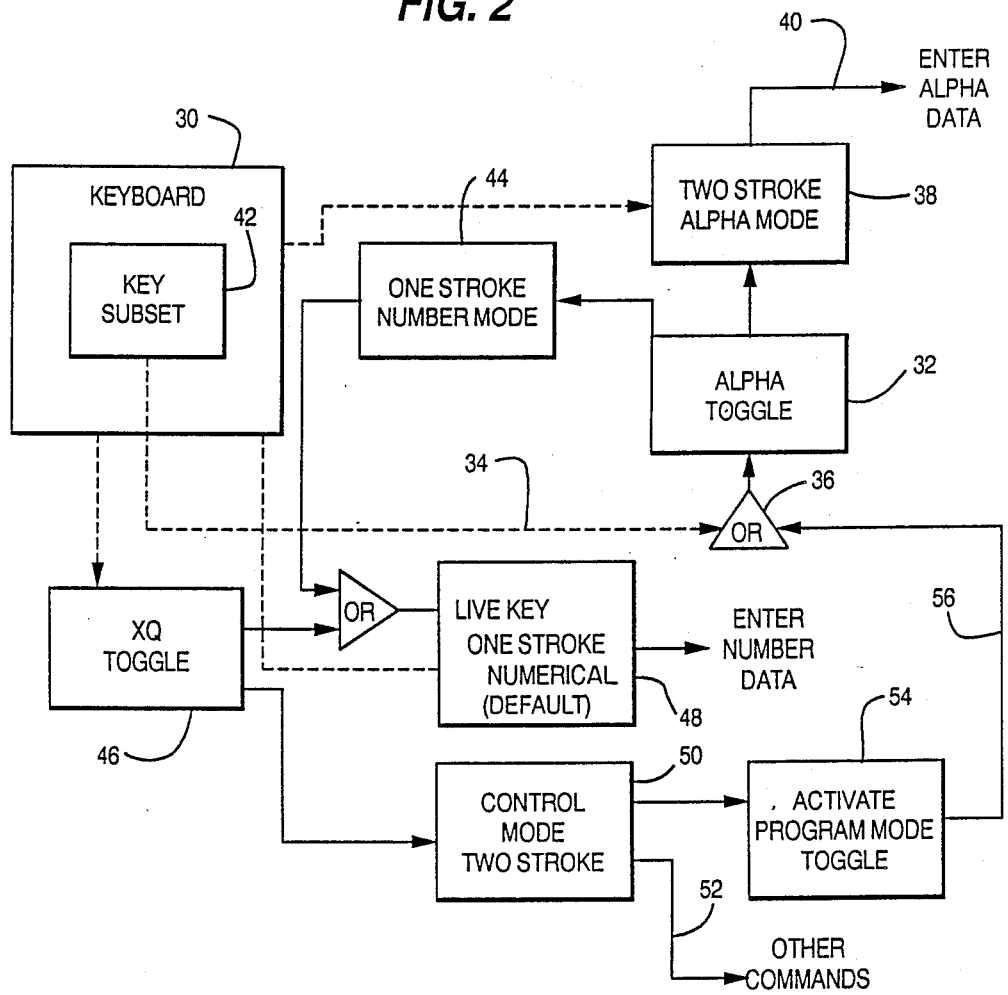
FIG. 2 is a block system diagram of a control means afforded in a preferred embodiment of the invention.

In the keyboard of FIG. 1, sixteen keys are provided with spacings for ready manual access, with primary live keyboard mode labels for the ten decimal digits 0 through 9 as indicated by the dashed line numbers, a decimal point and data entry key 10, arithmetic functions of subtract, add, multiply and divide as indicated by the key legends, and a control execute or mode shift key XQ 12. In the live keyboard entry mode the successive digits of a multiple digit decimal number word are entered by single key strokes until the word is terminated by a second stroke of the decimal point key 10 within the word, which ends the word and enters it into the calculator. This may be done since numerical words never encounter a second decimal point, and all such words have at least one decimal point even if not identified.

The entered data is then subject to the conventional commands such as the arithmetic commands directly available by a single key stroke. Also, any of the other multiplicity of secondary commands, whose functions are abbreviated in the chart sections integrally associated with keyboard assembly with the key and chart positioning being part of a coded indicia pattern that explicitly and simply directs an operator to make a selection of one or more key strokes. Appropriate calculator program subroutines are selected by entry of the commands.

For the change of mode from a numerical entry single stroke mode, where the entry is identified by the primary key legends (in dotted form for the numerical digits) to a two stroke mode by entry of secondary commands, one stroke of the XQ (execute) key 12 places the calculator in a multiple choice command entry control mode. In this command selection mode, two successive key strokes in a mutually exclusive time sequence are necessary for each entry and the indicia instructions immediately below all the keys (except the XQ key) identify all commands enterable by a first stroke of that key and identify the second key to be stroked. Thus, for a command selection in this mode, two successive key strokes of a predetermined combination of the sixteen keys is required to give a total number of selections of 16×16 or 256 commands. Thus, in the command selection mode, if the command selection desired is located in the charted blocks under one key such as cosine (COS) under key 3, the primary first key stroke is shown by location of the chart at key 3. The second key stroke is identified as key 5. In another example, to enter the program mode 14 as indicated by block 14 labelled PRGM, (if in the single stroke numeric mode) the XQ 12 key is stroked twice and the numeric "3" key identified in the function chart by reference number 16 is stroked. This will put the calculator into a program mode with the default numeric entry mode for live entry of the program data from the numeric keys.

Now in accordance with this invention either in the command selection mode or the program mode, a third command tier may be used to enter the alphanumeric mode. The two sequential key strokes to enter this mode (see lower right corner) are made with an XQ 12 key stroke and the entry/decimal point ( ∧ ) 10 key stroke.

In this alpha mode, the decimal point key 10 becomes the entry key as indicated by the arrow ( ∧ ) and the zero key 18 becomes the space key, as noted by the respective indicia on these keys. Also, in this alpha mode, the number one to nine keys are activated for a data and a command entry mode in response to two key strokes from predetermined combinations of that subset of nine keys. Again the choices are noted on the respective indicia charts on those keys.

Thus, in the alphanumeric mode, (capital) E is selected by a 5-5 key stroke sequence, the 5 key having reference number 20. As another example, a lower case e is selected by an 8-5 key stroke sequence (reference numbers 22 and 20 respectively). Note that since the period or decimal key 10 is now in the alpha entry key mode, the decimal or period is selected by a 2-2 key stroke sequence (the key having reference number 24). Also, note that commands may be selected in the alpha mode, such as "Rename" produced by the 7-9 key stroke sequence (reference numbers 26 and 28 respectively). Thus, with the subset of the nine numerical digit keys, eighty-one selections are made, including a full 26 character alphabet and all accompanying symbols generally found on a typewriter keyboard.

To select numbers on a live keyboard in this mode, the decimal point key 10 serves as an alpha toggle or shift key as designated to select either numerical or alpha modes. This retains the higher speed advantage of entering numerical data with a single key stroke per numerical digit. The enter function as aforesaid for any numerical word is by two successive strokes of the enter/decimal key (10), and similarly in the alpha mode the enter function following an alpha entry is by two successive strokes of that key.

To exit the alpha mode, the original alpha toggle XQ decimal point (∧) sequence is used (key 12 and 10 respectively). To exit the program mode, the XQ-3 sequence is used for activating the program toggle. In this case the default function alpha off is initiated. Clearly therefore the present invention offers a very simple and rapid way to write program steps in the alpha mode, and surprisingly permits a full selection of all typewriter key functions and 27 additional command (or data) entries with only twelve keys. (The numerical calculation function keys −, +, × ÷ not being required.)

The system organization is shown in the block functional flow diagram of FIG. 2. The key actuation function flow lines from the keyboard 30 are shown in dotted line form. Pertinent control function interactions are shown in full line form.

The novel feature afforded by this invention of unexpectedly greater keyboard capacity with a few keys, such as sixteen, for selection of a great number of command functions and all the alphabetic character selections usually performed on a full keyboard typewriter of over 50 keys is achieved by this system, in the manner hereinbefore described in connection with the keyboard of FIG. 1. A significant feature of the invention that cooperatively reduces programming and command entry time and trouble and makes the computer directly operable for a very large number of functions directly from its keyboard assembly without a programming manual is the coded relationship of the individual key sites with the commands available using these specific keys. Note that in this format there is room on the keyboard of a portable calculator to display all the program steps (16 in the one stroke mode, 256 in the command selection mode and 81 in the alpha program mode).

Additional novel features in the alphabetic mode of operation are provided, including the capacity to rapidly enter alphabetic information in the program mode for writing program steps. Thus, the alphabetic mode toggle 32 is actuated by the alpha command initiated by the two stroke sequence of the XQ key 12 and the decimal points key 10 in the command selection two stroke control mode, as represented along key actuation flow line 34, through OR circuit 36. This selects the alpha mode 38 where alphabetic data output characters are generated at 40 in response to two key strokes from the subset 42 of keys as hereinbefore described. The toggle is converted to the live key single stroke number entry mode 44 by further actuation of alpha toggle 32 from the keyboard 30 along line 34, such as by the use of the decimal key two stroke entry function, converted to this mode of operation in the alpha mode. Thus, alphanumeric entry from a few keys is feasible without relinquishing the desirable fast entry of numerical data with one stroke per entry line keyboard operation. In the two stroke alpha mode, the alphabetic characters are successively entered with each two stroke selection into a word until spaced by the space (0) key 18 (as distinguished from entry of a program step by the double stroke of decimal key 10). This computer system saves considerable time in entry of alpha data in the program mode over prior art systems, as discussed hereinafter. Note that line 34 is activated in the two stroke command entry mode.

In addition to the subset of keys 42, there is an XQ toggle 46 which upon receiving a two stroke sequence XQ operates toggle 46 to convert from the default condition of live key single stroke numerical entry mode 48 to the control mode 50 providing a set of commands such as 52 including the program mode activation toggle 54. By means of lead 56 and OR circuit 36 the alpha toggle 32 is activated to operate in the program mode for selection of either the default numeric live keyboard mode via 44 or the two stroke alphabetic entry mode via 38. Thus, the program steps may be quickly entered including any of the alphabetic characters with a minimum of command control function operations and with a minimum of keys, far fewer than conventionally needed on prior state of the art calculators capable of handling one full alphabet.

Although the preferred embodiment as discussed above used sixteen keys for the most efficacious operation, it is possible to achieve complete entry of all 26 alpha keys and the ten numeric keys with only six keys as is illustrated in FIG. 3. This could be a selected subset of keys in the preferred embodiment of FIG. 1. However, as can be seen the use of six keys in this manner does not allow the use of a decimal or control keys. Therefore, to use such a keyboard effectively, it is possible, of course, to eliminate some of the lesser used alpha keys such as the Q key 58 or the X key 60, or any other low case key. This technique would allow the use of a decimal key or "shift key" to allow the use of another mode.

Figure 4:
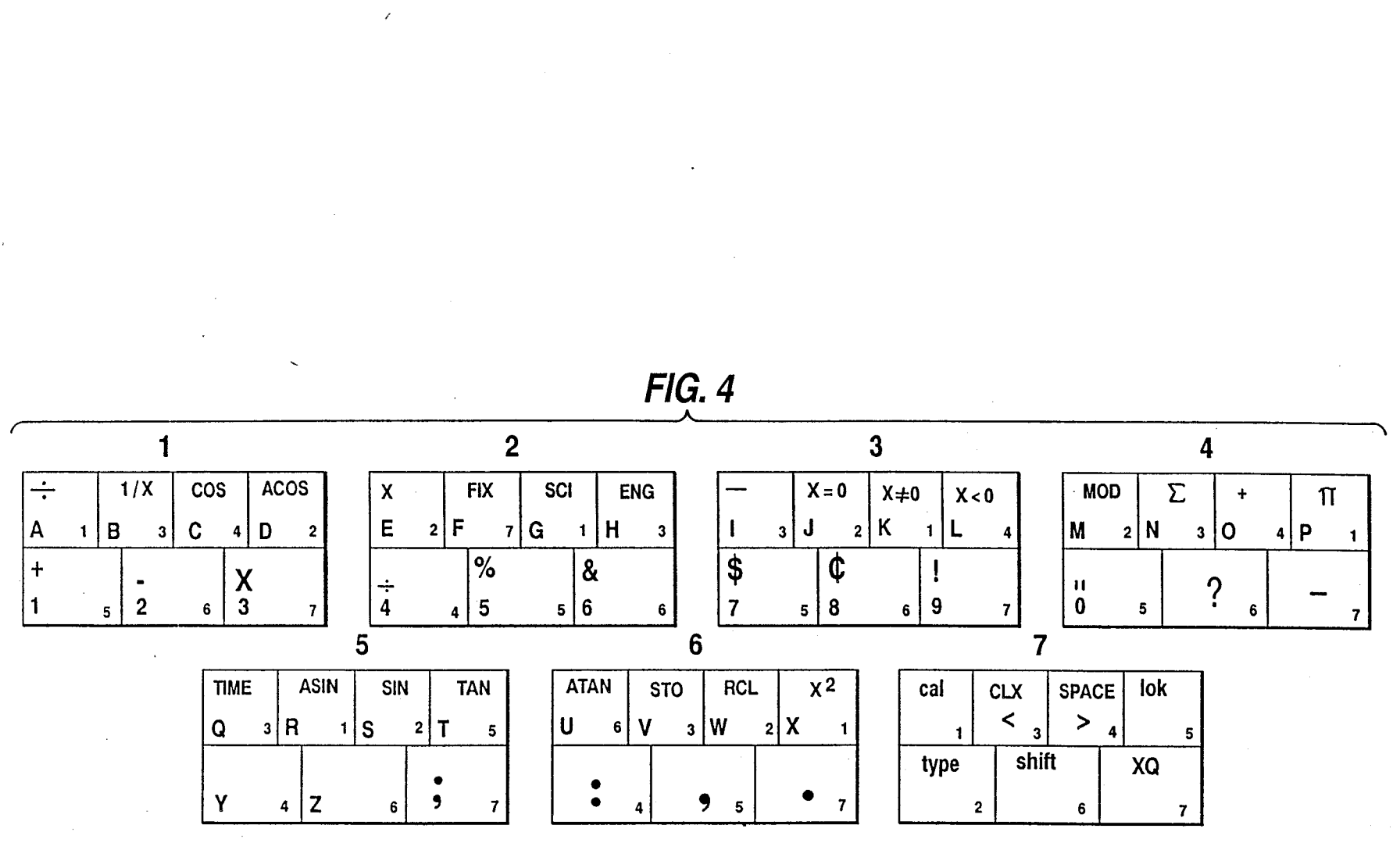

By the use of seven keys, however, the full alphabet, a decimal function and some control functions are available, such as shown in FIG. 4.

Although functioning keyboards which use only six or seven keys are possible, a twelve key keyboard such as shown in FIG. 5 represents a preferred simplified keyboard assembly with a working minimum, number of twelve keys. Thus, 144 functions are available in the two stroke mode with selections shown by the indicia on the respective keys in the twelve compartments. A further 12 keys operable in the one stroke mode are designated by the dotted legends, signifying numerical digits 0-9, a decimal point key operable in the manner aforesaid, and one execute key for changing the control mode.

The indicia on the keyboard of FIG. 5 codes the operational transaction necessary for each of the commands charted in a manner similar to FIG. 1. Thus, two sequential key strokes are required for each command displayed in the respective twelve individual cells of each of the command charts located in proximity to the respective keys 1, 2, 3, etc. Thus, the displayed indicia comprises coding means for the designation of the two keys and includes the charted sets of instruction indicia for a plurality of computer commands located respectively in the proximity of the different keys required to be stroked as the first of the required two successive strokes for entering a command. The proximity key location serves as the first key identification mode. Thus, for the numerical digit 1 the decimal point-enter key (∧) is always the first key stroke as is the case for the numerical digit 9, etc.

In each cell thus the indicia carries an abbreviated identification of a computer command, such as "enter the numerical digit 1" abbreviated 1 and further carrying the identification code description of the second key to be sequentially stroked to enter the command, namely the subscript key "name", 1 in the case of entry of the digit 1. Thus, the sequence of keys to enter the digit 1 would be to first stroke the decimal key and then to stroke the 1 key, etc.

The similar but expanded indicia features of FIG. 1 provide for a first operation mode of single key strokes noted on the primary key indicia means. The execute key XQ changes that mode to the two stroke mode just discussed with the charted sets of instruction indicia located in proximity to the respective keys serving the same functions in the same manner, except that prefix key symbols are used instead of subscripts.

A third tier of indicia is that located on numeric digit keys 1-9, wherein further sets of charted functions operate again in the same manner. Thus, there are two alternative modes where two key strokes actuate the computer command.

As before explained a program writing mode is initiated by XQ-3 key strokes when in the two stroke mode. In that program mode then the alpha mode is initiated by the XQ-∧ key strokes thereby activating the functional command set of instructions located on the chart sets on the respective keys. In this mode the operation is in the same manner as described for FIG. 5.

Having therefore advanced the state of the art, those novel features believed descriptive of the nature and spirit of the invention are defined with particularity in the following claims.

I claim:

1. The method of identifying and processing keyboard entered commands in a portable miniaturized multi-purpose programmable electronic computer with an operating system having alphanumeric data processing capabilities operable to process alphabetic characters and numeric digits in various operation modes from a set of data processing commands to which the computer responds in response to keystrokes from an accompanying keyboard located on a panel of said portable computer and coupled permanently thereto for entry of said processing commands with at least six keys for making the alphabetic character and numeric digit entries, comprising the steps of:

providing in a location visible along with the keyboard entry instructions displayed in a set of abbreviated instruction indicia designating a comprehensive set of computer entries of at least said alphabetic characters and set of data processing commands together with the sequence of keystrokes for those entries from the keyboard keys requiring more than one stroke per entry, thereby to reduce the need for reference to external manuals for operation and entry instructions for that comprehensive set of computer entries, establishing a two keystroke per entry mode of computer operation for making keyboard entries directly into the computer operating system by means of two successive keystrokes in mutually exclusive time sequence from a subset of said keys for processing those entries from the keyboard keys displayed in said set of indicia designated to have a two stroke entry sequence, thereby to decrease the number of keys necessary on the keyboard for processing a subset of said comprehensive set of entries by providing the capability for selecting for a subset of X keys a plurality of X times X individual entries, providing at least one other keystroke entry mode of computer operation for processing a further subset of the comprehensive set of entries including numeric digit entries with a single keystroke from a selected further subset of said keys, and providing in said visible instructions indicia coding for defining the two sequential keystrokes of said two stroke entry sequence for a plurality of different entries with the first sequential key to be stroked identified by placement of a chart in a location in the proximity of that key and with the second key of the two stroke entry sequence identified by a designation of one of said different entries with additional indicia of the particular key to be selected.

2. The method defined in claim 1 further comprising the steps of:

selectively providing a second said chart in said location in the proximity of a first keystroke entry key with indicia to designate a plurality of second keystroke selections to identify a different plurality of entries and operating the computer in another said two keystroke per entry mode activating the keys for an alternative set of computer entries.

3. The method defined by claim 1 further comprising the steps of:

establishing a program mode entry in said set of computer entries for computer operation permitting the writing of programs for said computer form keyboard entries, and establishing an alpha mode of data entry operable in the program mode for entering alphabetic characters into a computer program from a subset of the keys in the two keystroke per entry mode.

4. The method defined by claim 3 further comprising the step of entering said numeric digits into a said program from the keyboard in a one keystroke per entry mode of operation.

5. The method defined by claim 1 further comprising the step of providing in the keystroke entry mode with two and only two successive keystrokes still another mode of operation to enter commands from a subset of said keys for the entry of a substantially complete set of alphabet characters.

6. The method defined by claim 1 further comprising the steps of initiating a program mode of operation for writing programs by actuating the keys in which said two keystroke per entry mode enters alpha characters from a subset of no more than seven keys.

7. The method of identifying and processing keyboard entered commands in a portable miniaturized multi-purpose programmable electronic computer with an operating system having alphanumeric data processing capabilities operable to process alphabetic characters and numeric digits in various operation modes from a set of data processing commands to which the computer responds in response to keystrokes from an accompanying keyboard located on a panel of said portable computer and coupled permanently thereto for entry of said processing commands with at least six keys for making the alphabetic character and numeric digit entries, comprising the steps of:

providing in a location visible along with the keyboard entry instructions displayed in a set of abbreviated instruction indicia designating a comprehensive set of computer entries of at least said alphabetic characters and set of data processing commands together with the sequence of keystrokes for those entries from the keyboard keys requiring more than one stroke per entry, thereby to reduce the need for reference to external manuals for operation and entry instructions for that comprehensive set of computer entries, establishing a two keystroke per entry mode of computer operation for making keyboard entries directly into the computer operating system by means of two successive keystrokes in mutually exclusive time sequence from a subset of said keys for processing those entries from the keyboard keys displayed in said set of indicia designated to have a two stroke entry sequence, thereby to decrease the number of keys necessary on the keyboard for processing a subset of said comprehensive set of entries by providing the capability for selecting for a subset of X keys a plurality of X times X individual entries, providing at least one other keystroke entry mode of computer operation for processing a further subset of the comprehensive set of entries including numeric digit entries with a single keystroke from a selected further subset of said keys, and further comprising in the step of providing the indicia provision of a coded set of instructions for entries requiring a sequence of two keystrokes per entry in the format of a set of indicia charts respectively located in positions defining the location of a subset of several different said keys to be stroked for the first of the two keystrokes for entering a set of computer entry functions identified on such indicia charts with locations of the indicia charts corresponding to the respective location of those keys in said subset requiring the first keystroke entry, and providing further indicia in the charts identifying the second key to be stroked for entry of respective computer entry functions identified in the charts.

8. The method of identifying and processing keyboard entered commands and data into a multi-purpose electronic computer with alphanumeric data processing capabilities, and having a keyboard with a set of keys located in-situ for operating the computer manually, comprising the steps of:

operating the computer in a data and command entry mode requiring two successive mutually exclusive keystrokes from at least a subset of the keyboard keys for a selected set of data and command computer input entries, visibly indicating at the in-situ keyboard location instructions for operating the keyboard to select entries from said selected set comprising a corresponding set of abbreviated instruction indicia designating the two key sequences and corresponding computer input entries from various keystroke combinations from the keys in said subset, and coding specifically the abbreviated indicia to identify the first and second keys to stroke for the two stroke sequence for individual displayed computer data and command entries by means of a chart with a plurality of available computer input entries from said set identified thereon in a chart position code identifying the location of the first key to be stroked for those entries, and by means of further indicia identifying individual computer input entries from said set on the chart together with a coded identification of the second key to be stroked for the respective individual entries.

* * * * *